United States Patent
Record et al.

(10) Patent No.: US 7,019,983 B2
(45) Date of Patent: Mar. 28, 2006

(54) MOUNTING POWER HANDLING COMPONENTS ON PRINTED CIRCUIT BOARDS NEAR HIGH DENSITY ROUTING CHANNELS

(75) Inventors: Leslie J. Record, Round Rock, TX (US); William G. Kulpa, Lakeway, TX (US); Robert Gontarek, Austin, TX (US)

(73) Assignee: Newisys, Inc., Austin, TX (US)

( * ) Notice: Subject to any disclaimer, the term of this patent is extended or adjusted under 35 U.S.C. 154(b) by 273 days.

(21) Appl. No.: 10/602,366

(22) Filed: Jun. 23, 2003

(65) Prior Publication Data

US 2004/0257781 A1    Dec. 23, 2004

(51) Int. Cl.
*H05K 7/02* (2006.01)
*H05K 7/06* (2006.01)
*H05K 7/08* (2006.01)
*H05K 7/10* (2006.01)

(52) U.S. Cl. ............ 361/760; 361/785; 361/788; 361/790

(58) Field of Classification Search ........... 361/788, 361/790, 803, 785; 710/301, 306
See application file for complete search history.

(56) References Cited

U.S. PATENT DOCUMENTS

| 6,167,492 | A | 12/2000 | Keller et al. ............ 711/154 |
| 6,282,599 | B1 * | 8/2001 | Gallick et al. ............ 710/306 |
| 6,384,346 | B1 * | 5/2002 | Chang et al. ............ 174/261 |
| 6,385,705 | B1 | 5/2002 | Keller et al. ............ 711/154 |
| 6,490,661 | B1 * | 12/2002 | Keller et al. ............ 711/150 |
| 6,594,556 | B1 * | 7/2003 | Agatstein et al. ........ 700/298 |
| 6,608,761 | B1 * | 8/2003 | Wachel ............ 361/785 |
| 6,677,687 | B1 * | 1/2004 | Ho et al. ............ 307/43 |
| 6,771,515 | B1 * | 8/2004 | McCall et al. ............ 361/788 |
| 2005/0078463 | A1 * | 4/2005 | Chheda et al. ............ 361/789 |

OTHER PUBLICATIONS

*HyperTransport ™ I/O Link Specification Revision 1.03*, HyperTransport ™ Consortium, Oct. 10, 2001, Copyright © 2001 HyperTransport Technology Consortium.

* cited by examiner

*Primary Examiner*—Kamand Cuneo
*Assistant Examiner*—Yuriy Semenenko
(74) *Attorney, Agent, or Firm*—Beyer Weaver & Thomas, LLP

(57) ABSTRACT

An electronic assembly is described which includes a printed circuit board, and a processor and a memory mounted on the printed circuit board. A routing channel is provided in the printed circuit board comprising a plurality of conductors interconnecting the processor and the memory. A regulator assembly includes a regulator for providing power to the processor, a first connector mounted on the printed circuit board adjacent a first edge of the routing channel, and a second connector mounted on the printed circuit board adjacent a second edge of the routing channel opposite the first edge. The first and second connectors are coupled to the regulator and facilitate distribution of the power to the processor. The regulator and the first and second connectors form a bridge across the routing channel.

40 Claims, 2 Drawing Sheets

MOUNTING POWER HANDLING COMPONENTS ON PRINTED CIRCUIT BOARDS NEAR HIGH DENSITY ROUTING CHANNELS

BACKGROUND OF THE INVENTION

The present invention relates to printed circuit boards and, more specifically, to techniques for mounting power handling components on printed circuit boards in regions corresponding to high density routing channels.

Electronic assemblies constructed on printed circuit boards (PCBs) often employ point-of-use regulators in close proximity to the components to which they provide power for the purpose of reducing noise and power losses. For example, each processor on a computer system motherboard might have its own associated voltage regulator module (VRM).

Recent generations of processor designs have integrated the memory controllers which facilitate communication between the processors and associated memory. As a result, high density interconnects are provided directly between the processors and the memory. Because of the extremely high operational speeds of these processor designs, the dimensions of the conductors in such high density interconnects must be carefully controlled to mitigate undesirable transmission line effects and signal skew. This difficult design constraint is made more challenging by the introduction of through-holes and vias for components mounted on the PCB in the region of the routing channels in which the interconnects are disposed.

One solution is to eliminate components on the surface of PCBs corresponding to such routing channels. However, this wastes a considerable amount of otherwise usable PCB surface area. In addition, such an approach undesirably restricts the options for placing point-of-use regulators close to the components with which high density interconnects are associated.

Another approach is to provide an interposer structure between the surface of the PCB and the circuit to which power is to be provided to which the regulator may then be connected. The disadvantage of such an approach is that it may raise the height profile of the assembly beyond acceptable limits.

It is therefore desirable to provide alternative techniques by which power handling components (such as point-of-use regulators) may be mounted on PCBs in the vicinity of high density routing channels.

SUMMARY OF THE INVENTION

According to the present invention, techniques are provided by which power handling components may be mounted on PCBs in the vicinity of high density routing channels. According to one embodiment, the invention provides an electronic assembly which includes a printed circuit board, and a processor and a memory mounted on the printed circuit board. A routing channel is provided in the printed circuit board comprising a plurality of conductors interconnecting the processor and the memory. A regulator assembly includes a regulator for providing power to the processor, a first connector mounted on the printed circuit board adjacent a first edge of the routing channel, and a second connector mounted on the printed circuit board adjacent a second edge of the routing channel opposite the first edge. The first and second connectors are coupled to the regulator and facilitate distribution of the power to the processor. The regulator and the first and second connectors form a bridge across the routing channel.

According to another embodiment, an electronic assembly is provided which includes a printed circuit board having a plurality of circuits mounted thereon. A routing channel is provided in the printed circuit board comprising a plurality of conductors for interconnecting the plurality of circuits. A regulator assembly includes a regulator for providing power to at least one of the circuits, a first connector mounted on the printed circuit board adjacent a first edge of the routing channel, and a second connector mounted on the printed circuit board adjacent a second edge of the routing channel opposite the first edge. The first and second connectors are coupled to the regulator and facilitate distribution of the power to the at least one of the circuits. The regulator and the first and second connectors form a bridge across the routing channel.

According to another embodiment, an printed circuit board assembly is provided which includes a printed circuit board. A routing channel is provided in the printed circuit board comprising a plurality of conductors for interconnecting a plurality of circuits mounted on the printed circuit board. A first connector is mounted on the printed circuit board adjacent a first edge of the routing channel. A second connector is mounted on the printed circuit board adjacent a second edge of the routing channel opposite the first edge. The first and second connectors are configured to be coupled to a regulator and facilitate distribution of power therefrom to at least one of the circuits. The first and second connectors also being configured to form a bridge across the routing channel with the regulator.

A further understanding of the nature and advantages of the present invention may be realized by reference to the remaining portions of the specification and the drawings.

DETAILED DESCRIPTION OF SPECIFIC EMBODIMENTS

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details.

Figure 1:
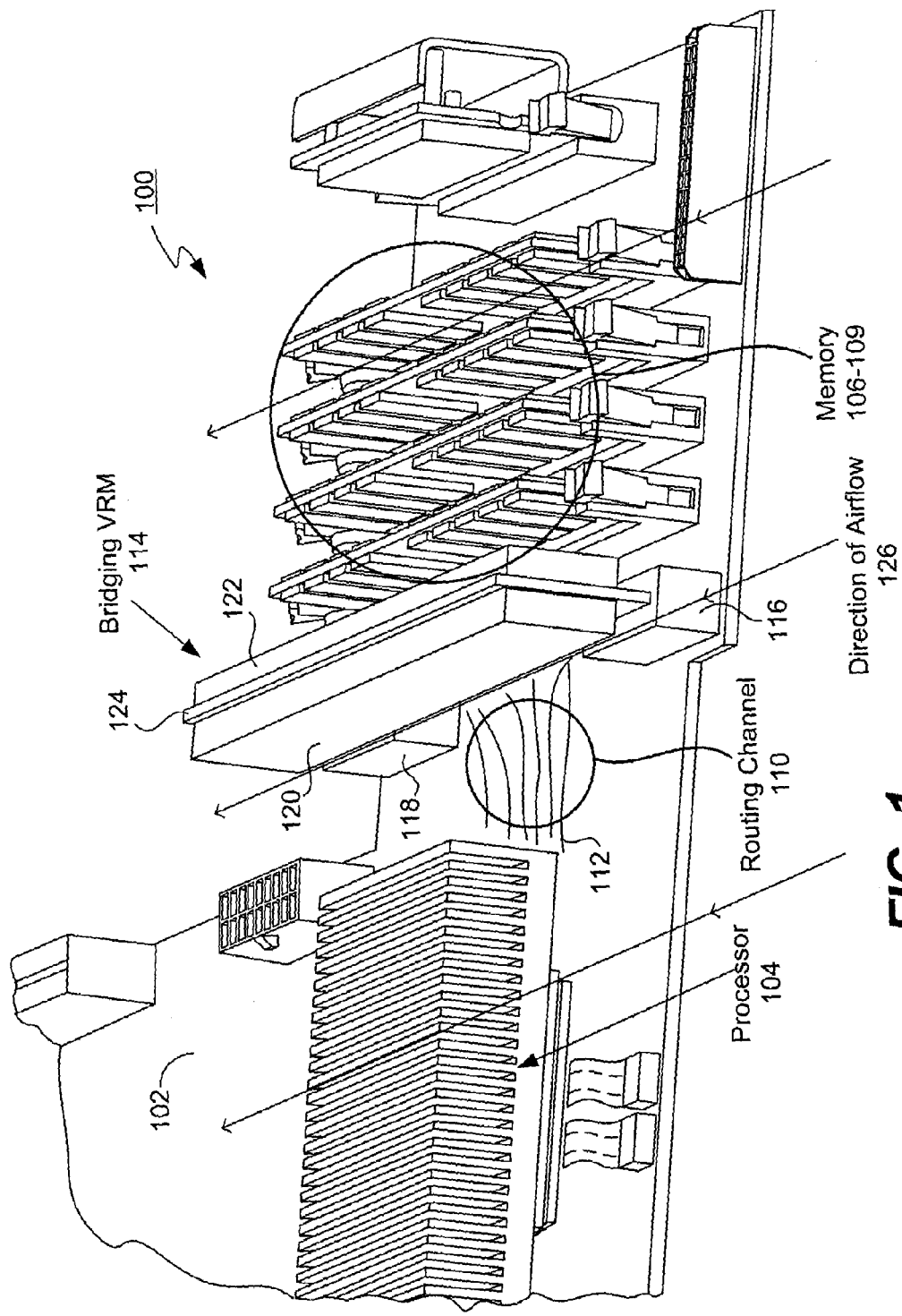
FIG. 1 is an illustration of an exemplary electronic assembly designed according to a specific embodiment of the present invention.

FIG. 1 is a simplified representation of a portion of a motherboard assembly 100 to facilitate illustration of a specific embodiment of the invention. It should be noted that the present invention is not limited to the type of assembly described. The foundation of motherboard 100 is a printed circuit board (PCB) 102 upon which is mounted a processor 104 and its associated memory modules 106–109. It will be understood that the system may include multiple processors, but that only one is shown for clarity. In this example, processor 104 includes a memory controller (not shown) to facilitate interaction with memory modules 106–109. It will also be understood that memory modules 106–109 may comprise any of a wide variety of commercially available memories.

A routing channel 110 is provided within the layers of PCB 102 in which a high speed interconnect (represented by phantom signal traces 112) between processor 104 and memory modules 106–109 is implemented. Because of the high speed with which signals are transmitted in this exemplary system, the dimensions of signal traces 112 are carefully controlled to mitigate transmission line effects and signal skew. For example, the lengths of selected ones of signal traces 112 are controlled to be substantially the same to ensure that corresponding signals arrive at their destinations at substantially the same time. According to a specific embodiment, because of the routing constraints associated with traces 112, the use of through-holes and vias in the region of routing channel 110 is minimized.

According to a specific embodiment, a voltage regulator module (VRM) 114 is provided in close proximity to processor 104 to provide power corresponding to the core voltages of processor 104. According to one embodiment, VRM 114 is a switching regulator. According to alternative embodiments, other types of regulators may be employed to provide power to processor 104. In general, a wide variety of regulator designs may be employed with the various embodiments of the present invention. In some embodiments, the VRMs employed may conform schematically to existing VRM specifications from companies such as Intel and Advanced Micro Devices. However, as will be understood, the physical configuration of VRMs used with the present invention may vary from such conventional specifications as described below.

Referring once again to the embodiment shown in FIG. 1, VRM 114 is mounted on PCB 102 via connectors 116 and 118 which are disposed on either side of routing channel 110. Connectors 116 and 118 provide the electrical connections by which control and power signals may be transmitted to and from corresponding signal traces (not shown) in PCB 102, and by which the distribution of power to processor 104 is facilitated.

According to various alternative embodiments, more than two connectors may be provided to support power handling components according to the present invention. Additionally, in embodiments where the VRM board is not in contact with the surface of the printed circuit board, additional spacers or support structures may be provided in the space between the VRM and the PCB.

According to various embodiments, the manner in which control and power signals are allocated between (or among) the connectors supporting the VRM may vary in accordance with the particular application. For example, output power delivered by VRM 114 may be evenly distributed between connectors 116 and 118. Alternatively, power may be distributed by connectors 116 and 118 according to the requirements of the circuitry to which the power is being provided. Input power to VRM 114 may also be allocated between the connectors to suit the configuration of components of which the VRM is constructed. In general, a wide variety of different combinations of power and control signals may be allocated to the different connectors to suit the particular application, e.g., control signals may be provided via one connector and power signals via another, or various combinations of control and power in each. In addition, the number of pins for each connector will be determined, at least in part, with reference to the necessary current carrying capacity for the various power supply rails supported.

According to various embodiments, connectors 116 and 118 may comprise conventional PCB edge connectors. According to one such embodiment, VRM 114 comprises circuitry (represented by volumes 120 and 122) disposed on either or both sides of a PCB 124 which has signal traces (not shown) on each of its lower corners which correspond to and are configured to connect with conductors in connectors 116 and 118. It will be understood that the layout of components within volumes 120 and 122 may vary considerably depending on the requirements of each particular application. In addition, it should be understood that any of a wide variety of connector types, e.g., pin connectors or card edge connectors, may be used to implement the various embodiments of the invention.

According to some embodiments, and as shown in FIG. 1, connectors 116 and 118 may support VRM 114 such that it does not come into contact with the surface of PCB 102. According to other embodiments, contact with the PCB surface may be allowed.

According to a particular embodiment of the invention, and as shown in FIG. 1, VRM 114 is aligned in such a manner as to provide some advantages with respect to the thermal management of the system. That is, VRM 114 is aligned with the system enclosure air flow (represented by arrows 126) to ensure proper cooling. This is advantageous in that the VRM supporting a processor's core voltages is one of the higher dissipation devices in the system. In the configuration shown, positioning the VRM between the processor and memory also ensures that the VRM will not be receiving or become a source of preheated air relative to either the processor or memory.

In addition, and according to an even more specific embodiment, a VRM mounted according to the present invention may be part of a thermal management infrastructure. For example, the VRM assembly may act as a baffle, segregating air flow regions, and inhibiting or otherwise mitigating the recirculation of preheated air.

Figure 2A:
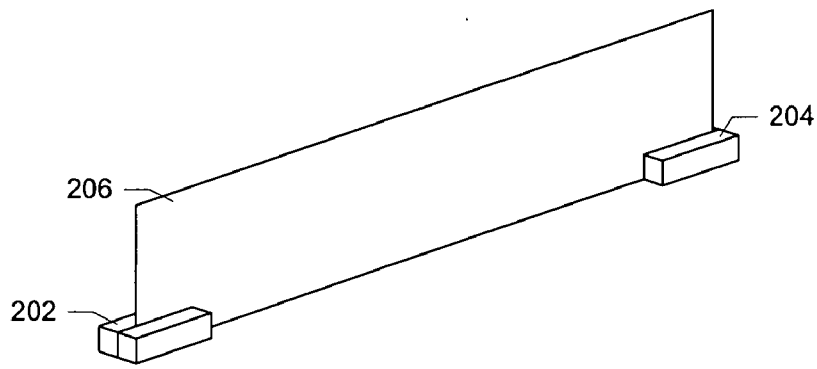
FIGS. 2A–2C illustrate some alternative configurations of a bridging assembly designed according to a specific embodiment of the invention.
Figure 2B:
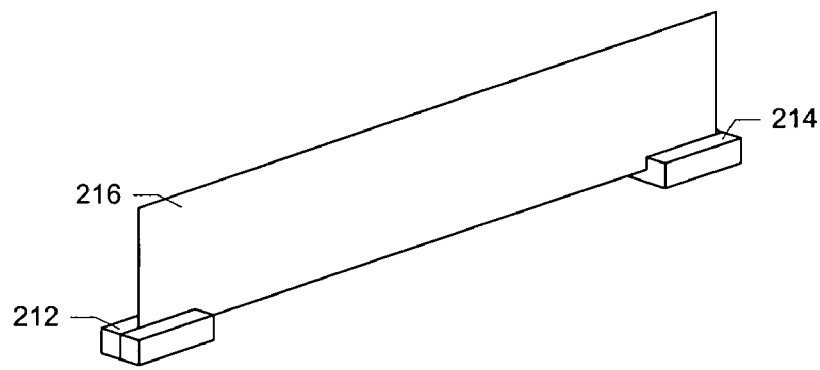
Figure 2C:
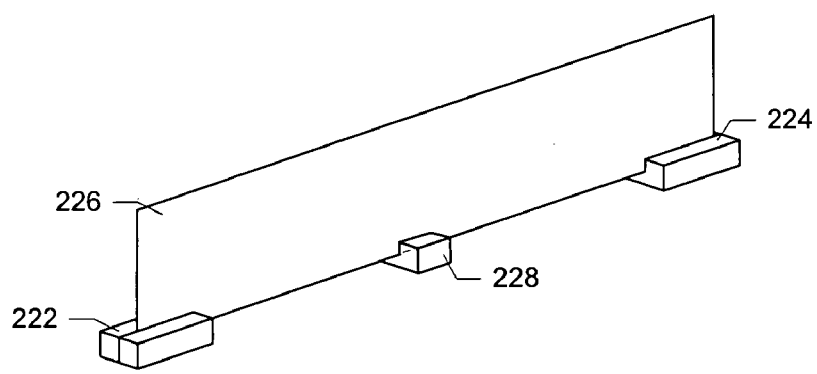

FIGS. 2A–2C show some exemplary configurations for a bridging assembly designed according to various alternative embodiments of the present invention. In FIG. 2A, connectors 202 and 204 are mounted on the surface of a PCB (not shown) and coupled to a bridging assembly card 206 which may be in contact with the PCB. Alternatively, as shown in FIG. 2B, connectors 212 and 214 may be configured such that bridging assembly card 216 is separated from the PCB surface. In addition and as mentioned above, at least one additional connector or spacer/support structure 228 may be provided in the routing channel between connectors 222 and 224 to either connect with and/or provide mechanical support for bridging assembly card 226.

In embodiments where structure(s) 228 represents a mechanical support, there may be little or no disruption of the routing channel in the PCB (e.g., a mechanical support might require a hole in the PCB for mounting). In embodiments where structure 228 represents an additional connector, some disruption of the routing channel may occur, but this would be considerably less than if a single unbroken connector for card 226 cut across the routing channel. In addition, any disruption introduced by such a connector can be mitigated by, for example, restricting PCB connections to the additional connector(s) to surface traces.

While the invention has been particularly shown and described with reference to specific embodiments thereof, it will be understood by those skilled in the art that changes in the form and details of the disclosed embodiments may be made without departing from the spirit or scope of the invention. For example, embodiments of the invention have been described which relate to mounting power handling components across routing channels. However, it will be understood that the techniques of the present invention may be employed to mount any of a wide variety of components in the region of a routing channel without disturbing the routing channel with through-holes or vias. Examples of such components may include low speed components, other types of regulators, and even other assemblies, e.g., daughter cards. Moreover, the power delivered by a regulator configured according to the present invention may be distributed to any of a wide variety of devices, as well as more than one device simultaneously.

In addition, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. An electronic assembly, comprising:
   a printed circuit board;
   a processor mounted on the printed circuit board;
   a memory mounted on the printed circuit board;
   a routing channel in the printed circuit board comprising a plurality of conductors interconnecting the processor and the memory; and
   a regulator assembly comprising a regulator for providing power to the processor, a first connector mounted on the printed circuit board adjacent a first edge of the routing channel, and a second connector mounted on the printed circuit board adjacent a second edge of the routing channel opposite the first edge, the first and second connectors being coupled to the regulator and facilitating distribution of the power to the processor, the regulator and the first and second connectors forming a bridge across the routing channel.

2. The electronic assembly of claim 1 wherein the processor comprises one of a plurality of processors mounted on the printed circuit board.

3. The electronic assembly of claim 1 wherein the processor comprises a memory controller operable to facilitate communication between the processor and the memory.

4. The electronic assembly of claim 1 wherein the memory comprises a plurality of memory modules mounted on the printed circuit board.

5. The electronic assembly of claim 1 wherein the first and second connectors are respectively configured to distribute substantially equal portions of the power to the processor.

6. The electronic assembly of claim 1 wherein the first and second connectors are respectively configured to distribute unequal portions of the power to the processor.

7. The electronic assembly of claim 1 wherein the regulator is in contact with a surface of the printed circuit board.

8. The electronic assembly of claim 1 wherein the regulator is separated from a surface of the printed circuit board.

9. The electronic assembly of claim 1 wherein the regulator comprises a second printed circuit board having regulator circuit components mounted thereon.

10. The electronic assembly of claim 9 wherein the regulator circuit components form a switching regulator circuit.

11. The electronic assembly of claim 9 wherein the first and second connectors comprise edge connectors operable to receive the second printed circuit board.

12. The electronic assembly of claim 1 wherein the processor is mounted in a first air flow region of the printed circuit board and the memory is mounted in a second air flow region of the printed circuit board, and wherein the regulator assembly is configured to inhibit air flow between the first and second air flow regions.

13. The electronic assembly of claim 1 wherein a longitudinal axis of the regulator assembly is aligned with an air flow vector corresponding to a cooling system associated with the electronic assembly.

14. The electronic assembly of claim 1 further comprising at least one additional connector for facilitating distribution of the power mounted on the printed circuit board in the routing channel between the first and second connectors.

15. The electronic assembly of claim 1 further comprising at least one support structure supporting the regulator in the routing channel.

16. The electronic assembly of claim 1 wherein the routing channel comprises a high-speed, high-density routing channel in which selected ones of the plurality of conductors are substantially equal in length.

17. The electronic assembly of claim 1 wherein the regulator assembly is mounted in close proximity to the processor as a point-of-use regulator.

18. An electronic assembly, comprising:
    a printed circuit board having a plurality of circuits mounted thereon;
    a routing channel in the printed circuit board comprising a plurality of conductors for interconnecting the plurality of circuits; and
    a regulator assembly comprising a regulator for providing power to at least one of the circuits, a first connector mounted on the printed circuit board adjacent a first edge of the routing channel, and a second connector mounted on the printed circuit board adjacent a second edge of the routing channel opposite the first edge, the first and second connectors being coupled to the regulator and facilitating distribution of the power to the at least one of the circuits, the regulator and the first and second connectors forming a bridge across the routing channel.

19. The electronic assembly of claim 18 wherein the first and second connectors are respectively configured to distribute substantially equal portions of the power to the at least one of the circuits.

20. The electronic assembly of claim 18 wherein the first and second connectors are respectively configured to distribute unequal portions of the power to the at least one of the circuits.

21. The electronic assembly of claim 18 wherein the regulator is in contact with a surface of the printed circuit board.

22. The electronic assembly of claim 18 wherein the regulator is separated from a surface of the printed circuit board.

23. The electronic assembly of claim 18 wherein the regulator comprises a second printed circuit board having regulator circuit components mounted thereon.

24. The electronic assembly of claim 23 wherein the first and second connectors comprise edge connectors operable to receive the second printed circuit board.

25. The electronic assembly of claim 18 wherein the at least one circuit is mounted in a first air flow region of the printed circuit board and others of the plurality of circuits are mounted in a second air flow region of the printed circuit board, and wherein the regulator assembly is configured to inhibit air flow between the first and second air flow regions.

26. The electronic assembly of claim 18 wherein a longitudinal axis of the regulator assembly is aligned with an air flow vector corresponding to a cooling system associated with the electronic assembly.

27. The electronic assembly of claim 18 further comprising at least one additional connector for facilitating distribution of the power mounted on the printed circuit board in the routing channel between the first and second connectors.

28. The electronic assembly of claim 18 further comprising at least one support structure supporting the regulator in the routing channel.

29. The electronic assembly of claim 18 wherein the regulator assembly is mounted in close proximity to the at least one circuit as a point-of-use regulator.

30. A printed circuit board assembly, comprising:
   a printed circuit board;
   a routing channel in the printed circuit board comprising a plurality of conductors for interconnecting a plurality of circuits mounted on the printed circuit board;
   a first connector mounted on the printed circuit board adjacent a first edge of the routing channel; and
   a second connector mounted on the printed circuit board adjacent a second edge of the routing channel opposite the first edge;
   wherein the first and second connectors are configured to be coupled to a regulator and facilitate distribution of power therefrom to at least one of the circuits, the first and second connectors also being configured to form a bridge across the routing channel with the regulator.

31. The printed circuit board assembly of claim 30 wherein the first and second connectors are respectively configured to distribute substantially equal portions of the power to the at least one of the circuits.

32. The printed circuit board assembly of claim 30 wherein the first and second connectors are respectively configured to distribute unequal portions of the power to the at least one of the circuits.

33. The printed circuit board assembly of claim 30 wherein the first and second connectors are configured to secure the regulator is in contact with a surface of the printed circuit board.

34. The printed circuit board assembly of claim 30 wherein the first and second connectors are configured to secure the regulator separated from a surface of the printed circuit board.

35. The printed circuit board assembly of claim 30 wherein the regulator comprises a second printed circuit board having regulator circuit components mounted thereon, the first and second connectors comprising edge connectors operable to receive the second printed circuit board.

36. The printed circuit board assembly of claim 30 wherein the first and second connectors are configured to orient the regulator to inhibit air flow between first and second air flow regions on the printed circuit board.

37. The printed circuit board assembly of claim 30 wherein the first and second connectors are configured to orient the regulator such that a longitudinal axis of the regulator is aligned with an air flow vector corresponding to a cooling system associated with the electronic assembly.

38. The printed circuit board assembly of claim 30 further comprising at least one additional connector for facilitating distribution of the power mounted on the printed circuit board in the routing channel between the first and second connectors.

39. The printed circuit board assembly of claim 30 further comprising at least one support structure operable to support the regulator in the routing channel.

40. The printed circuit board assembly of claim 30 wherein the first and second connectors are mounted such that the regulator is operable as a point-of-use regulator for the at least one circuit.

* * * * *